United States Patent [19]

Engel

[11] Patent Number: 5,266,809
[45] Date of Patent: Nov. 30, 1993

[54] IMAGING ELECTRON-OPTICAL APPARATUS

[75] Inventor: Wilfried Engel, Berlin, Fed. Rep. of Germany

[73] Assignee: Max-Planck-Gesellschaft zur Foerderung der Wissenschaften e.V., Fed. Rep. of Germany

[21] Appl. No.: 630,519

[22] Filed: Dec. 20, 1990

[30] Foreign Application Priority Data

Dec. 28, 1989 [DE] Fed. Rep. of Germany ....... 3943211

[51] Int. Cl.$^5$ ............................................. H01J 37/26
[52] U.S. Cl. ................... 250/397; 250/396 R; 250/305; 250/306; 250/307
[58] Field of Search ............... 250/392, 305, 306, 307, 250/309, 398, 310, 311; 313/105 R, 105X

[56] References Cited

U.S. PATENT DOCUMENTS

| | | | |
|---|---|---|---|
| 3,617,741 | 9/1969 | Siegbahm | 250/305 |
| 3,758,778 | 9/1973 | Braunlich | 250/307 |
| 3,937,957 | 2/1976 | Schillalies et al. | 250/305 |
| 4,096,386 | 6/1978 | Rempfer et al. | 250/306 |

OTHER PUBLICATIONS

Rev. Sci. Instrum. 59(6), Jun. 1988 "Photoelectron microscopy with synchrotron radiation" pp. 853–858, B. P. Tonner under G. R. Harp. DE-PS 907 449.
Nuclear Instruments and Methods 97 (1971), Switen 405–408, "Channel Electron Multiplier Efficiency for 10–1000 eV Electrons" F. Bordoni.
The Review of Scientific Instru. vol. 40, No. 5, May 1969 "Degradation of Continuous–Channel Electron Multipliers in a Laboratory Operating Environ", L. A. Frank, N.K. Henderson, R. L. Swisher, Switen 685–689.
IEEE Transactions on Nuclear Science, Jun. 1968, vol. NS-15, No. 3, "A directional, low energy elect. detector employing chann. elect. multiplers", Switen 536–540, J. R. Sharber, J. D. Winningham, W. R. Sheldon.
Appl. Phys. A 44, 55–61 (1987) "Surface Imaging with LEEM" W. Telieps, Switen 55–61.
Nuclear Instru. and Methods in Physics Research A247 (1986) 379–384, No. 2 "Measurement of the detection efficiency of microchannel plates for 1–15 keV electrons", G. Klingelhoofer, H. Wiacker, E. Kankeleit, Switen 379–384.
"Ultramicroscopy 17 (1985) 57–66, No. Holland, Amsterdam An analytical reflection and edmission UHV surface electron miscroscope", W. Telieps and E. Bauer.
J. Phys. E: Sci. Instrum., vol. 13, 1980. "Absolute quantum efficiencies of micro-channelplates for 8–20 keV electrons", R. W. Wijnaendts van Resandt, Switen 1162–1164.

Primary Examiner—Jack I. Berman
Assistant Examiner—Kiet T. Nguyen
Attorney, Agent, or Firm—Handal & Morofsky

[57] ABSTRACT

Imaging electron-optical apparatus, e.g. photo-electron emission microscope, which has an electron-optical imaging system in which electrons of an electron pattern to be imaged are accelerated to a maximum energy of at least several $10^3$ electron volts and a real image of said electron pattern is produced in an image plane, and further has a channel-plate image intensifier which receives and amplifies the electrons which form the real image; the image intensifier has a luminescence screen positioned in the path of the amplified electrons. A decelerating electrostatic lens is provided in the path of the electrons before they enter the image intensifier, to produce an electrical field which reduces the energy of the electrons which enter the image intensifier; the energy is reduced to a value at which said channel-plate electron intensifier has a higher sensitivity or gain than with the maximum acceleration energy in the imaging system.

14 Claims, 4 Drawing Sheets

IMAGING ELECTRON-OPTICAL APPARATUS

BACKGROUND OF THE INVENTION

1. Field of the invention

The invention relates to an imaging electron-optical apparatus, e.g. photo-electron emission microscope, in which a final electron image produced by an electron-optical imaging system of the apparatus is intensified by an electron multiplier.

2. Description of the Related Art

Image amplifiers are used in numerous electron-optical apparatus. Typical examples are photo-electron emission microscopes and reflection microscopes of the Bauer and Telieps type. The latter type of apparatus is known as "LOW ENERGY ELECTRON REFLECTION MICROSCOPE", dubbed LEERM OR LEEM in scientific publications (W. Telieps and E. Bauer, Ultramicroscopy 17 (1985) 57).

An effective and low-cost solution of the image intensifier problem is the channel-plate electron multiplier (in short, "channel plate"), which is directly exposed to the electron pattern that represents the final image produced in the imaging electron-optical apparatus. This is specifically true when large image areas, i.e. a large number of picture elements or pixels, are to be amplified or intensified. A channel-plate image intensifier generally comprises at least one channel-plate followed by a transparent luminescent screen which is positioned in close proximity parallel to an output surface of the channel-plate. The electron pattern amplified within the channels of the channel-plate(s) is accelerated onto the luminescent screen and simultaneously approximately focussed so that a visible optical image is produced by the impinging electrons.

The use of channel-plate image intensifiers in such imaging electron optical apparatus as photo-electron emission microscopes and reflection microscopes is known ( see e.g. B. P. Tonner et al., Rev. Sci. Instrum. 59 (1988) 853 and the above mentioned paper by Telieps et al.).

SUMMARY OF THE INVENTION

An object of the invention is to provide an imaging electron-optical apparatus which comprises a channel-plate image intensifier in which the image-intensifier operates in a more effective way than in the prior art apparatus.

According to a embodiment of the invention, the sensitivity or image intensification is increased by reducing the energy of the image-producing electrons, which enter the channel-plate electron multiplier, to values which render the channel-plate multiplier more sensitive or more capable of amplification than they would be using the electron energies which are usual in the known imaging electron-optical apparatus and which generally are at least $5 \times 10^3$ keV up to several $10^4$ keV.

According to a further preferred feature of the electron-optical apparatus according to the invention the means for producing a decelerating electrical field is an electrostatic electron lens which is constructed and positioned so that the ray path of the electrons representing the final image is telescopic or telecentric. Thus the paths of all of the electrons entering the channel plate have the same angle, e.g. 90 degrees, with respect to the entrance surface of the channel plate, independent of the location within the image. Thus, the angle between the paths of the incoming electrons and the axis of the channels of the channel-plates (which are generally oblique with respect to the entrance surface) is independent of the position within the image. Thus, any position-dependency of the channel-plate sensitivity caused by position-dependent variations of the impingement angle of the electrons is avoided.

BRIEF DESCRIPTION OF THE DRAWINGS

Preferred embodiments of the invention will now be described in detail with reference to the accompanying drawings, in which:

FIG. 1b is a diagram of the electrical potential $\phi$ on the z axis (lens axis) of the electron lens system shown in FIG. 1a;

FIG. 1c is a depiction of the path of the electrons in the electron lens system of FIG. 1a;

FIG. 2b is a diagram of the magnetic induction B (dashed curve) and the electrical potential $\phi$ (solid curve) on the axis of the electron lens system shown in FIG. 2a;

DESCRIPTION OF THE PREFERRED EMBODIMENTS

Figure 1C:
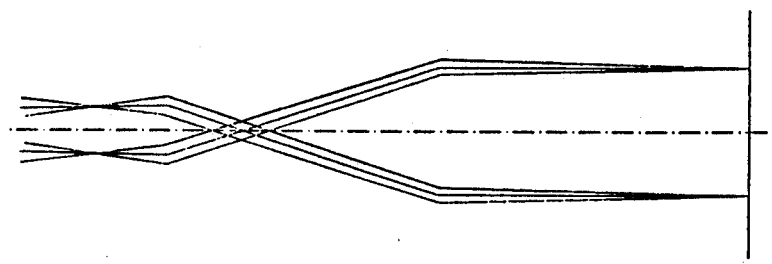
Figure 1B:
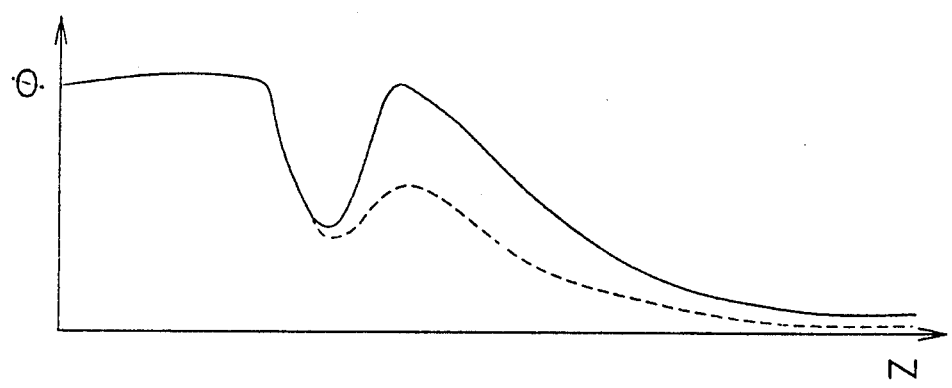
Figure 1A:
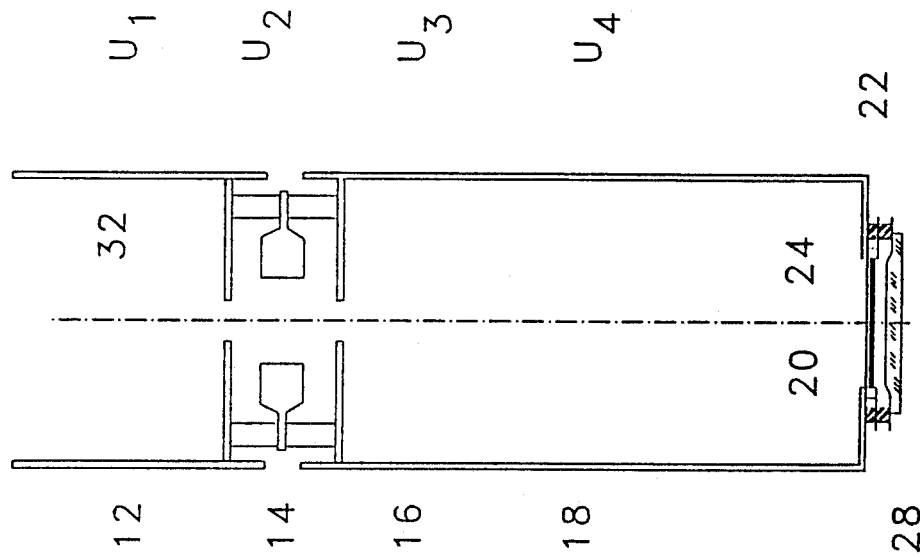
FIG. 1a is a simplified view in axial section of an electrostatic electron lens system for an imaging electron-optical apparatus according to a first embodiment of the invention.

FIG. 1a is a simplified view in axial section of a fully electrostatic lens system which is suitable as deceleration projector (projector lens) of an electron microscope and which comprises a channel-plate image intensifier for increasing the intensity of the final electron image produced by the electron lens system. As a typical example, the electron lens system of FIG. 1a may be a projector of a conventional transmission electron microscope, which furthermore may comprise objective and condensor lenses (not shown).

The image projector of FIG. 1a is a tetrode system including electrodes 12, 14, 16 and 18. Electrodes 12 and 16 each include, as shown, a tubular part and an apertured plate or diaphragm-like part and form together with the essentially annular electrode 14 an electrostatic einzel lens. The tubular part of the electrode 16 and the likewise tubular electrode 18 form a tubular electrostatic lens.

In operation, potentials $U_1$, $U_2$, $U_3$ and $U_4$ are applied to the electrodes 12, 14, 16 and 18, respectively. These potentials are referenced to the potential of an electron source (not shown) which is zero, e.g. ground potential.

A channel-plate 20 of a channel-plate image intensifier 22 is positioned at the far end of electrode 18 with respect to electrode 16. A translucent luminescent screen is positioned in close proximity and parallel to an output surface of the channel-plate image intensifier to form an image intensifier and converter which amplifies the electron image and converts the intensified electron image to a visible optical image. The translucent luminescent screen 24 is applied to the inner surface of a viewing window 26. The luminescent screen 24 is provided with a thin metal film (not shown) and connected to an electrode 30.

A suitable set of potential values is $U_1=U_3=20$ kV; $U_4=1$ kV; $U_2=0$ V. An advantage of these potentials is that only the potential $U_4$ has to be provided for the lens system. $U_4$ is chosen so that the maximum sensitivity of the channel-plate image intensifier is obtained. The other potentials are inherently present in the electron microscope. $U_4$ can have a fixed value if the properties of the channel-plate multiplier are known and do not vary with time.

The above type of simple set of potential values allows selection of a lens configuration which produces an enlarged and distortion-free image by means of a telescopic ray path as shown in FIG. 1c. The lens is rotationally symmetrical and the potential $\phi$ on the axis of rotation 32 of the lens of FIG. 1a is shown by a solid line in FIG. 1b. If the lens configuration has been selected for a specific value of $U_4$, and later $U_4$ has to be varied, the desired properties of the lens can be restored by selecting appropriate values of the potentials $U_2$ and $U_3$. Thus, if $U_4$ has to be variable, also the potentials $U_2$ and $U_3$ must be variable in order to obtain optimum conditions. For example, when $U_4$ has to be reduced, then $U_3 < U_1$ and $U_2 > 0$, so that a potential pattern $\phi(z)$ results as shown by the dashed line in FIG. 1b.

The projector lens system shown in FIG. 1a can be regarded as a two-lens system consisting of an einzel lens 12, 14–16 and a tubular lens 16–18, the reduction of the electron velocity being effected within the tubular lens. The desired telescopic ray path (FIG. 1c) is obtained when the focal point of the image side of the einzel lens coincides with the object-side focus point of the tubular lens. This is the case in point F in FIG. 1c in which the parallel incident rays intersect the axis.

Figure 2B:
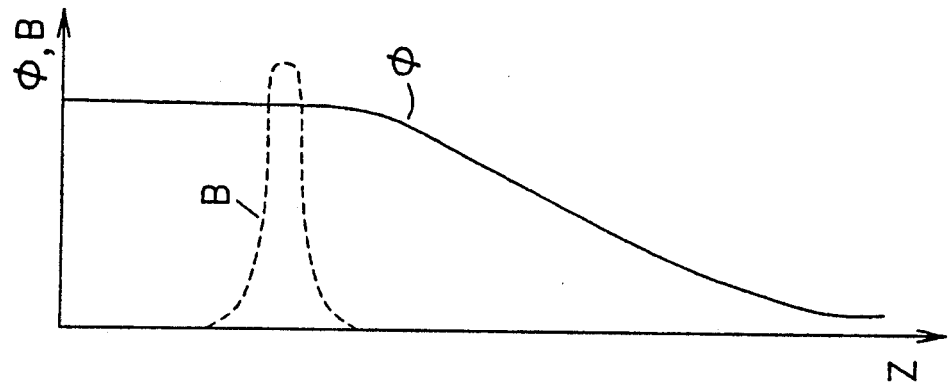
Figure 2A:
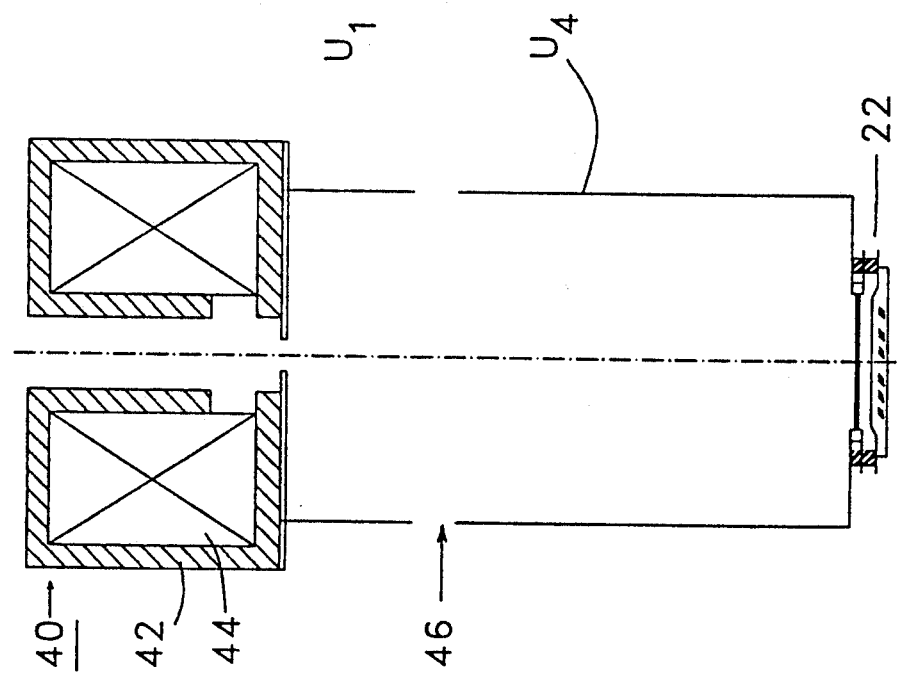
FIG. 2a is a simplified view in axial section of a magnetic-electrostatic electron lens system for an electron-optical apparatus according to a second embodiment of the invention.

Division of the function of the lens system of FIG. 1a into the einzel lens and the tubular lens helps to understand the operation of the lens system and shows that a lens system with the desired properties can also be implemented by the combination of magnetic and electrostatic lens fields as shown in FIGS. 2a and 2b.

The lens system shown in FIG. 2a, which may be used as magnetic-electrostatic deceleration projector, includes a magnetic lens 40 instead of the electrostatic einzel lens of the system of FIG. 1a. The magnetic lens 40 has an iron circuit 42 and an excitation winding 44. The electromagnetic lens 40 is followed by a tubular lens 46 and a channel-plate image intensifier and converter 22 similar to that shown in FIG. 1a. Also in this case, the tubular lens 46 is effective in reducing the electron velocity to a value which assures maximum sensitivity of the channel-plate multiplier.

Figure 3:
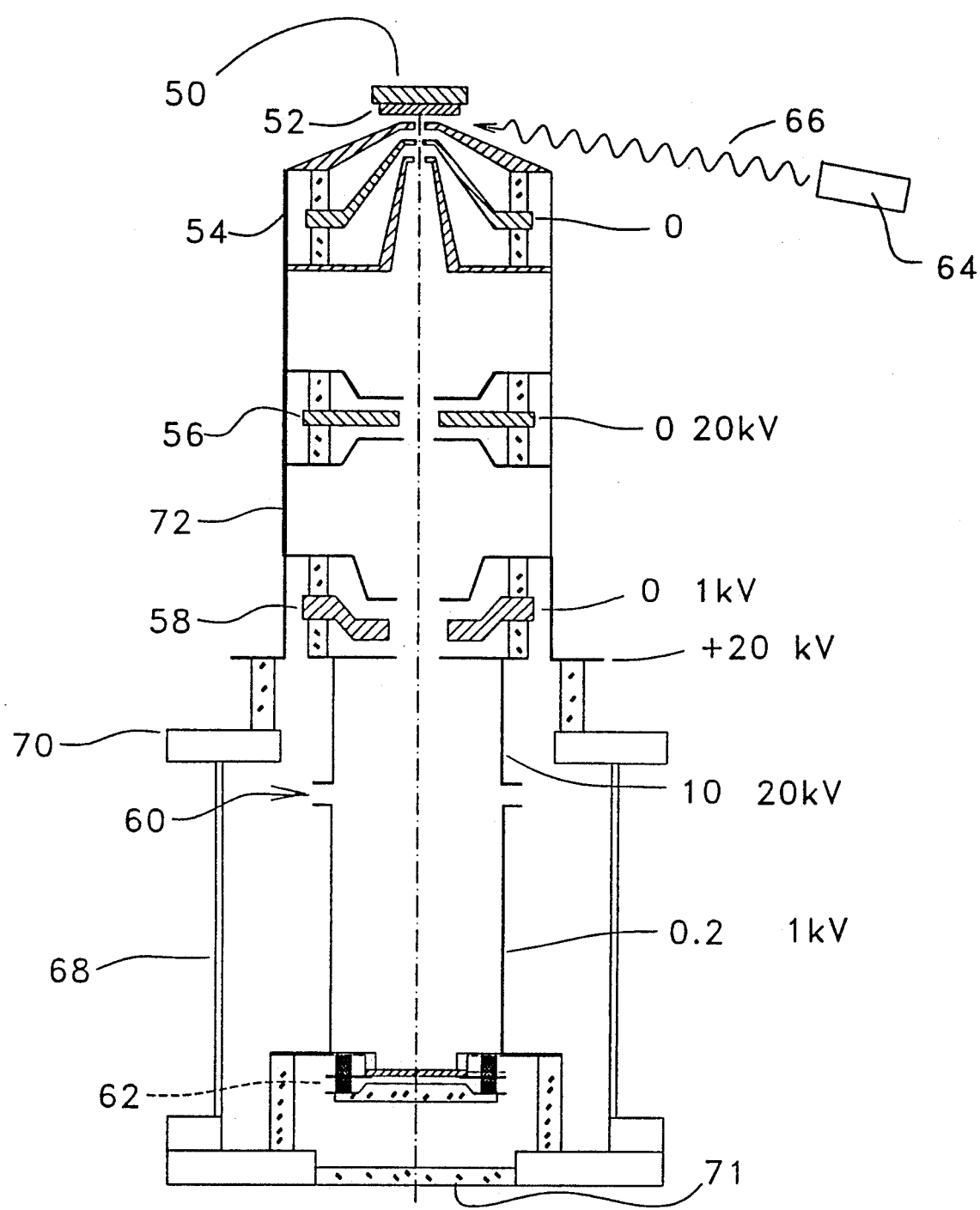
FIG. 3 is a somewhat simplified view in axial section of a photo-electron emission microscope according to a further embodiment of the invention.

The optimum energy of the electrons entering the channel-plate multiplier depends on the type of the channel-plate(s) and, to some extent, on its history, e.g. whether the channel-plates had been subjected to atmospheric pressure for an extended period. The range of the optimum input energies of the present channel-plate electron multipliers are generally between about 200 eV and about 2000 eV. Thus, generally the energy of the electrons entering the channel-plate will be selected to be below 3 keV. FIG. 3 is a simplified view in axial section of a further preferred embodiment of the invention. The electron microscope of FIG. 3 comprises means 50 for supporting an electrically conductive specimen or sample whose surface is to be investigated.

The electron microscope comprises an electron-optical imaging system including an electrostatic objective lens 54, an electrostatic intermediate lens 56 and a projector comprising an electrostatic einzel lens 58 and a tubular lens 60. The imaging system has an object plane which coincides with the sample surface. The input surface of a channel-plate image intensifier and converter 62 is positioned in the image plane of the projector. A radiation source 64 emitting optical (electromagnetic) radiation 66 is provided for releasing photoelectrons from the sample surface to be investigated, the quantum energy of the radiation 66 being sufficiently high to afford the emission of photoelectrons from the surface of the sample 52. The emitted electrons form a pattern or electron image which is enlarged and imaged onto the entrance surface of the channel-plate image intensifier and converter 62 by the electron-optical imaging system including the objective 54, the intermediate lens 56, and the projector comprised of the einzel lens 58 and the tubular lens 60. The objective 54 and the intermediate lens 56 produce an intermediate image in the entrance-side focus plane of the projector 58, 60 so that a telescopic or telecentric ray path results, as explained with reference to FIG. 1c. The telescopic ray path provides a uniform angle of entrance of the electrons across the entire entrance surface of the channel-plate image intensifier 62.

The described imaging system 54, 56, 58, 60 and the image intensifier 62 and an outer vacuum-tight housing 68 which has a window 71 for viewing the luminescence screen of the image intensifier 62 are supported by a standard flange 70, e.g. a CF-type flange NW 150, so that the apparatus can be mounted in any position on a flanged port of a vacuum chamber. The length of the portion of the apparatus which projects inwards from the flange 70 (upwards in FIG. 3) is chosen so that the distance between a reference or abutting surface of the flange 70 and the surface of the sample or object to be investigated is 254 mm. This is the standard distance for LEED-optical devices. Thus, the microscope can be mounted on any flange which is adapted for receiving a LEED-optical device.

It has been usual up to now to apply a negative high voltage to the object, e.g. the sample 52, in an electron microscope. This is not the case in the present apparatus. The sample is maintained at ground potential so that any available accessory devices, e.g. for heating or cooling and measuring the temperature of the sample or manipulating it can be used. Thus, a positive accelerating high voltage is applied to an inwardly extending tube 72 of the microscope, this voltage being generally at least 5 kV and usually in the range of $10^4$ volts, e.g. $+20$ kV. The tube 72 is electrically and mechanically connected to outer annular electrodes of the objective lens 54 and the intermediate lens 56 as well as to a source-side frusto-conical shaped annular electrode of the projector einzel lens 58. The vacuum housing 68 is grounded via the flange 70 and encloses the outwardly extending portion of the electrode system which includes the deceleration lens 60 and the channel-plate image intensifier 62. Intermediate insulating elements are used to support various parts of the apparatus as shown in FIG. 3.

Figure 4:
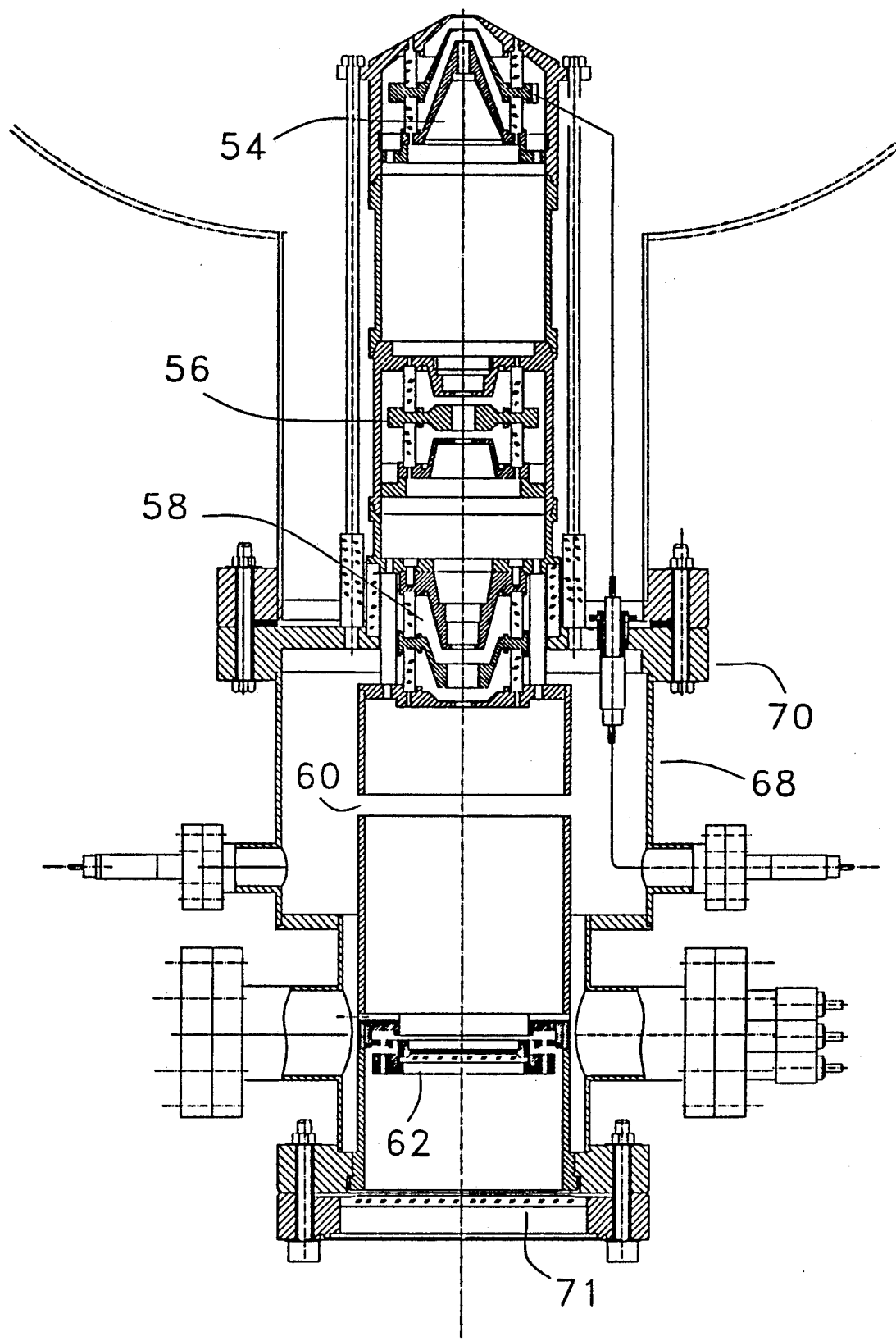
FIG. 4 is a more detailed view in axial section of the microscope shown in FIG. 3.

FIG. 4 is a more detailed view of a practical embodiment of the apparatus explained with reference to FIG. 3. The same reference numerals are used in FIG. 3 and 4 so that no further explanation should be necessary.

The support 50, the sample 52 and the radiation source 64 are not shown in FIG. 4.

Various modifications and adaptations of the described embodiments will occur to those skilled in the art.

What is claimed is:

1. An imaging electron-optical apparatus comprising an electron-optical imaging system (54, 56, 58, 60) for producing a real image of an electron pattern in an image plane of said system, said electrons being accelerated to a maximum energy in excess of $10^3$ eV in the course of forming said real image, and channel-plate image intensifier means (62) arranged for receiving said electrons forming said real image to multiply said electrons, characterized by means (60) for reducing the energy of said electrons which form said real image and enter said image intensifier means to a value at which said image intensifier means has a higher sensitivity than for electrons having said maximum energy to which the electrons are accelerated in said imaging system, said energy reducing means being positioned in the path of the electrons before they enter said channel-plate image intensifier means (62).

2. The apparatus as claimed in claim 1 wherein said imaging system is operated with an accelerating voltage of at least 5 kV and said energy reducing means reduces the energy of the electrons entering said channel-plate image intensifier to a value below 3 keV.

3. The apparatus as claimed in claim 1 wherein said energy reducing means comprises an electrostatic lens (16, 18) for producing a decelerating electric field.

4. The apparatus as claimed in claim 3, wherein said electrostatic lens (16, 18) is included in said electron-optical imaging system and arranged to produce a telescopic ray path of the electrons which enter said channel-plate image intensifier means (62).

5. The apparatus as claimed in claim 3 wherein said lens (16, 18) which produces said decelerating electrical field is a portion of a projector of an electron microscope.

6. The apparatus as claimed in claim 3 wherein said lens (16, 18) which produces said decelerating electrical field is a portion of a projector of an electron microscope, said projector including an electrostatic einzel lens (12, 14, 16) and said electrostatic lens (16, 18) which produces said electron decelerating electrical field.

7. The apparatus as claimed in claim 3, wherein said lens (16, 18) which produces said decelerating electrical field is a portion of a projector of an electron microscope said projector including an electromagnetic lens (40) and said electrostatic lens (16, 18) which produces said electron decelerating electrical field.

8. The apparatus as claimed in claim 1 wherein said image intensifier means includes a luminescent screen positioned in the path of the multiplied electrons.

9. The apparatus as claimed in claim 8 further comprising means (50) for supporting a specimen (52) having a surface to be investigated, said supporting means being adapted to position said surface in an object plane of said electron microscope, and radiation source means (64) for producing radiation directed to said surface and adapted to release electrons from said surface.

10. The apparatus as claimed in claim 1 wherein said imaging system (54, 56, 58, 60) and said image intensifier (62) are mounted on a standard vacuum system flange (70).

11. The apparatus as claimed in claim 10 wherein said flange has a reference plane and the distance between said reference plane and an object plane of said imaging system is 254 mm.

12. The apparatus as claimed in claim 1, further comprising means for supplying an accelerating voltage to said imaging system, said accelerating voltage being positive with respect to ground.

13. The apparatus as claimed in claim 10, characterized by a housing (68) made of metal, said housing being mounted on said flange (71), being provided with a window (71) through which said luminescent screen can be observed, and enclosing said channel-plate image intensifier and a portion of said imaging system which extends in outward direction from said flange.

14. The apparatus as claimed in claim 9, wherein said radiation source emits electro-magnetic radiation.

* * * * *